US006736678B2

(12) United States Patent
Yao

(10) Patent No.: US 6,736,678 B2
(45) Date of Patent: May 18, 2004

(54) MEMORY CARD INTERFACE ADAPTER

(76) Inventor: Li-Ho Yao, 4F, No. 99, Tungan St., Taipei (TW)

( * ) Notice: Subject to any disclaimer, the term of this patent is extended or adjusted under 35 U.S.C. 154(b) by 0 days.

(21) Appl. No.: 10/179,250

(22) Filed: Jun. 26, 2002

(65) Prior Publication Data

US 2004/0002264 A1 Jan. 1, 2004

(51) Int. Cl.$^7$ ............................................. H01R 25/00
(52) U.S. Cl. ...................................... 439/638; 361/685
(58) Field of Search .................. 439/638, 76.1, 439/945, 946, 630, 637; 361/685, 683, 684, 395, 737

(56) References Cited

U.S. PATENT DOCUMENTS

| | | | | |
|---|---|---|---|---|
| 5,184,282 A | * | 2/1993 | Kaneda et al. | 361/395 |
| 5,519,571 A | * | 5/1996 | Shieh | 361/685 |
| 5,906,516 A | * | 5/1999 | Sato et al. | 439/630 |
| 6,050,848 A | * | 4/2000 | Yao | 439/483 |
| 6,257,902 B1 | * | 7/2001 | Shieh | 439/76.1 |
| 6,264,506 B1 | * | 7/2001 | Yasufuku et al. | 439/638 |
| 6,385,677 B1 | * | 5/2002 | Yao | 710/102 |
| 2002/0178207 A1 | * | 11/2002 | McNeil | 709/102 |
| 2003/0100203 A1 | * | 5/2003 | Yen | 439/79 |

* cited by examiner

Primary Examiner—P. Austin Bradley
Assistant Examiner—Phuongchi Nguyen
(74) Attorney, Agent, or Firm—Bacon & Thomas, PLLC

(57) ABSTRACT

A memory card interface adapter has an adapter body with the appearance and size the same as a CF card, a chamber defined in the adapter body to receive a memory card, an L-shaped circuit board placed inside the adapter body, and a connector and a connecting port both disposed in the adapter body. The connector and the connecting port are respectively corresponded to a CF card standard and a USB interface standard. Therefore when the memory card is installed in the adapter body and electrically linked with the circuit board, the memory card is able to be accessed by an external device with a CF card interface or a USB interface.

5 Claims, 7 Drawing Sheets

MEMORY CARD INTERFACE ADAPTER

BACKGROUND OF THE INVENTION

1. Field of Invention

The present invention relates to a memory card interface adapter, and more particularly to an adapter that converts a memory card with a interface into a compact flash card (CF card) interface or a universal serial bus (USB) interface.

2. Related Art

Since memory cards were developed they have steadily gained popularity among the multiple kinds of storage media because of their small size and large capacity. Since the memory cards have such a large consumption market, memory card developers and manufacturers have presented their own card with a particular standard now. Although many kinds of memory card are available for consumers, the card manufacturers still devote their efforts to the development of the small volume and large storing capacity memory cards. However the storage capacity of a present memory card may be expanded, the size is limited to its original specification. For example, the connecting interface of a compact flash card (CF card) has fifty pins to perform an electrical link with any instrument. However such an interface standard with so many pins will cause difficulty in reducing the size of the CF card.

Although a new developed memory card, such as a card, has advantages of small size and large capacity, the new memory card may difficult to operate in coordination with present devices, such as card readers, because the new standard of the memory card is not popularized yet. Moreover, the computer is a main device that operates with the memory card, and has developed many different types of I/O interfaces, such as the high data transmission speed interface, the USB. However most of the I/O interfaces of the computer do not directly match the memory cards, thus the application of memory cards suffer many limitations.

To overcome the shortcomings, a memory card interface adapter in accordance with the present invention obviates or mitigates the aforementioned drawbacks.

SUMMARY OF THE INVENTION

The primary objective of the present invention is to provide a memory card interface adapter that converts a memory card into a CF card standard or a USB standard so that the STONE memory card is able to be accessed by more apparatus.

To achieve the objective, the memory card interface adapter utilizes the components described hereinafter to perform the interface conversion.

An adapter body is defined with a chamber to receive a memory card being interface converted, wherein the appearance of the adapter body is the same as a CF card.

A circuit board formed substantially as an "L" shape is arranged inside the adapter body.

A first connector in the memory card interface adapter corresponds to the memory card being interface converted and electrically connects with the circuit board.

A second connector has a first particular interface, such as a CF card interface, wherein the second connector is electrically linked with the first connector via the circuit board.

A connecting port has a second particular interface, such as a USB interface, wherein the connecting port is also electrically linked with the first connector and the second connector via the circuit board.

When the memory card being converted is placed in the adapter body and electrically connected with the first connector, the memory card is able to be accessed through the CF card interface or the USB interface.

Other objectives, advantages and novel features of the invention will become more apparent from the following detailed description when taken in conjunction with the accompanying drawings.

DETAILED DESCRIPTION OF THE INVENTION

Figure 1:
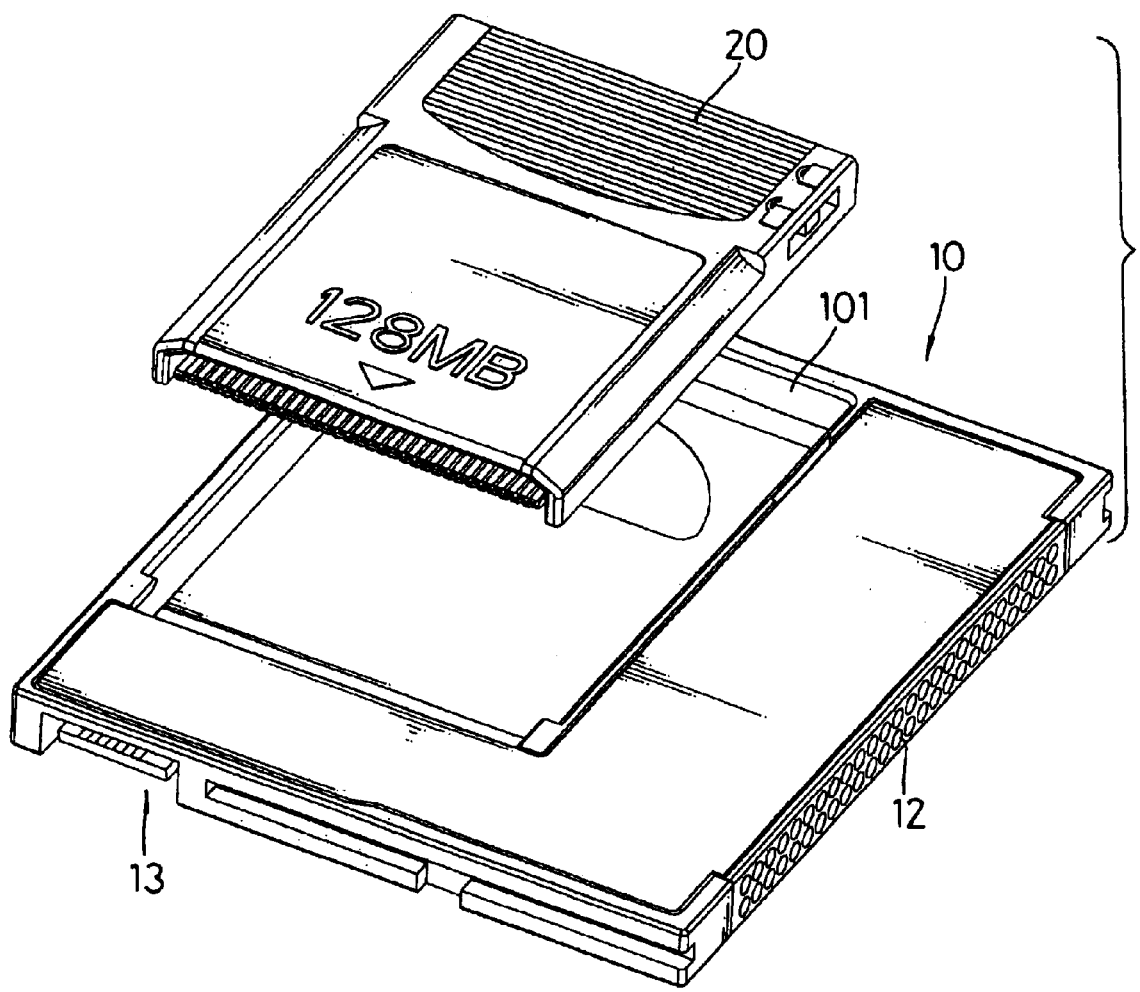
FIG. 1 is an exploded perspective view showing a memory card and a memory card interface adapter in accordance with the present invention.

With reference to FIG. 1, an adapter body (10) is defined with a chamber (101) to receive a memory card (20) being converted, wherein the memory card (20) is a card in this embodiment. A second connector (12) and a connecting port (13) are respectively disposed at two adjacent sides of the adapter body (10). Both the second connector (12) and the connecting port (13) are electrically linked with the memory card (20) via a circuit board (15)(not shown in FIG. 1), whereby the data stored in the memory card (20) is able to be accessed through the second connector (12) or the connecting port (13). In this embodiment, the second connector (12) is a compact flash card (CF card) standard, and the connecting port (13) is a universal serial bus (USB) standard. Therefore, the memory card (20) is able to be read/written by an external device that connects to the CF card interface or the USB interface.

Figure 2:
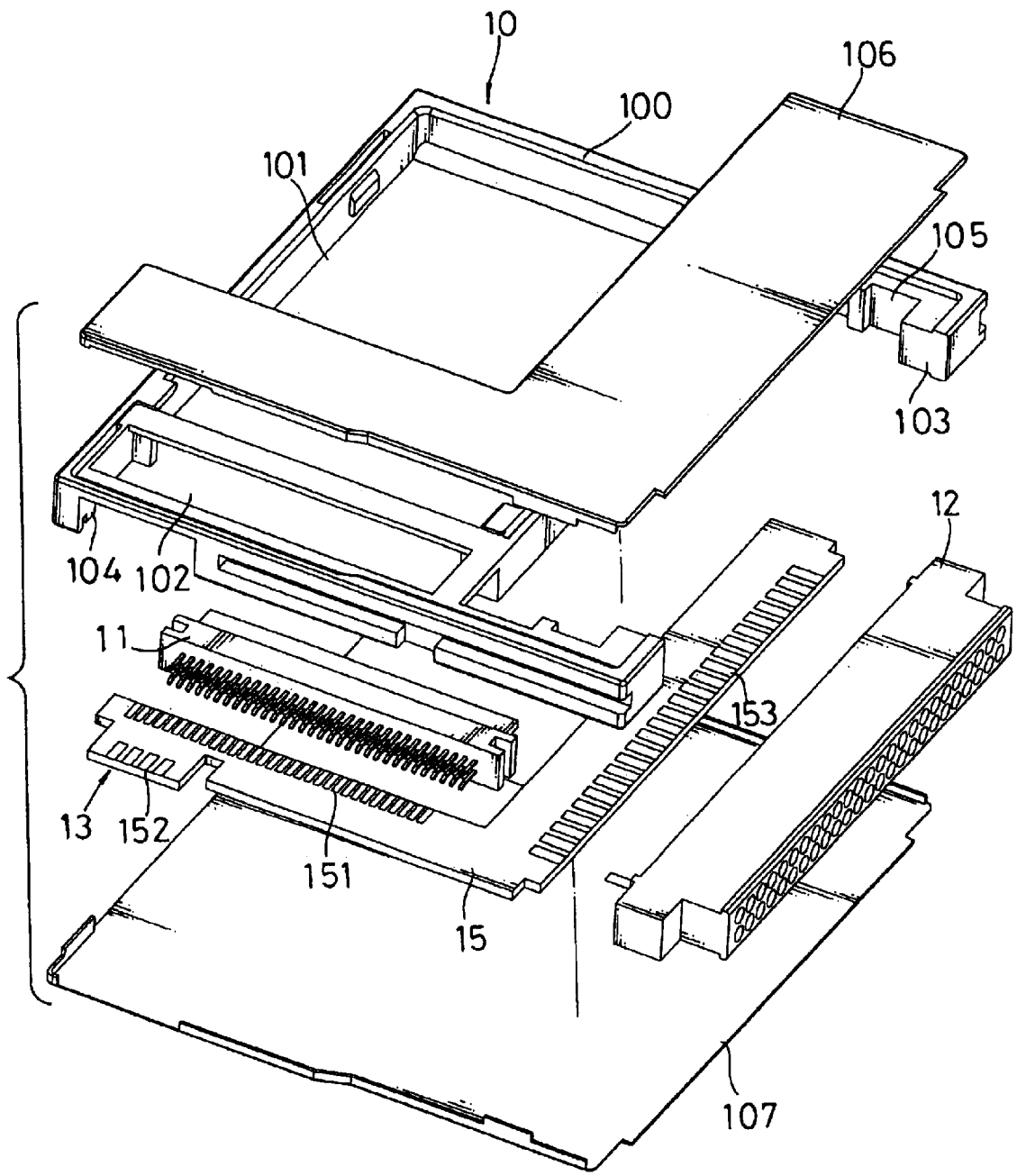
FIG. 2 is an exploded perspective view of the memory card interface adapter of FIG. 1 in accordance with the present invention.

With reference to FIG. 2, the appearance and the size of the adapter body (10) is fabricated as a CF card. The adapter body (10) mainly comprises a top plate (106), a bottom plate (107) and a U-shaped frame (100) sandwiched between the top plate (106) and the bottom plate (107). The frame (100) is composed of a first side, a second side and a third side respectively connected between one end of the first side and the second side, so that a breach (103) is defined by the other end of the first side and the second side. The frame (100) further has a substantially T-shaped partition (not numbered) with three ends respectively connected to three sides of the frame (100), whereby the frame (100) together with the partition defines the first chamber (101), a second chamber (102) and a third chamber (not numbered). The second chamber (102) communicates with the third chamber to form a substantially L-shaped space. A pair of gaps (105) are respectively defined at two opposite sides of the frame (100) near the first breach (103) to correspondingly wedge two protrusions extending from two opposite ends of the second connector (12). A second breach (104) is defined at one side of the frame (100) and communicates with the second chamber (102) to receive the connecting port (13).

The top plate (106) is formed as an L-shaped plate to correspondingly cover the top of the second chamber (102) and the third chamber. The circuit board (15) is correspondingly placed in the L-shaped space defined by the second chamber (102) and the third chamber.

Figure 3A:
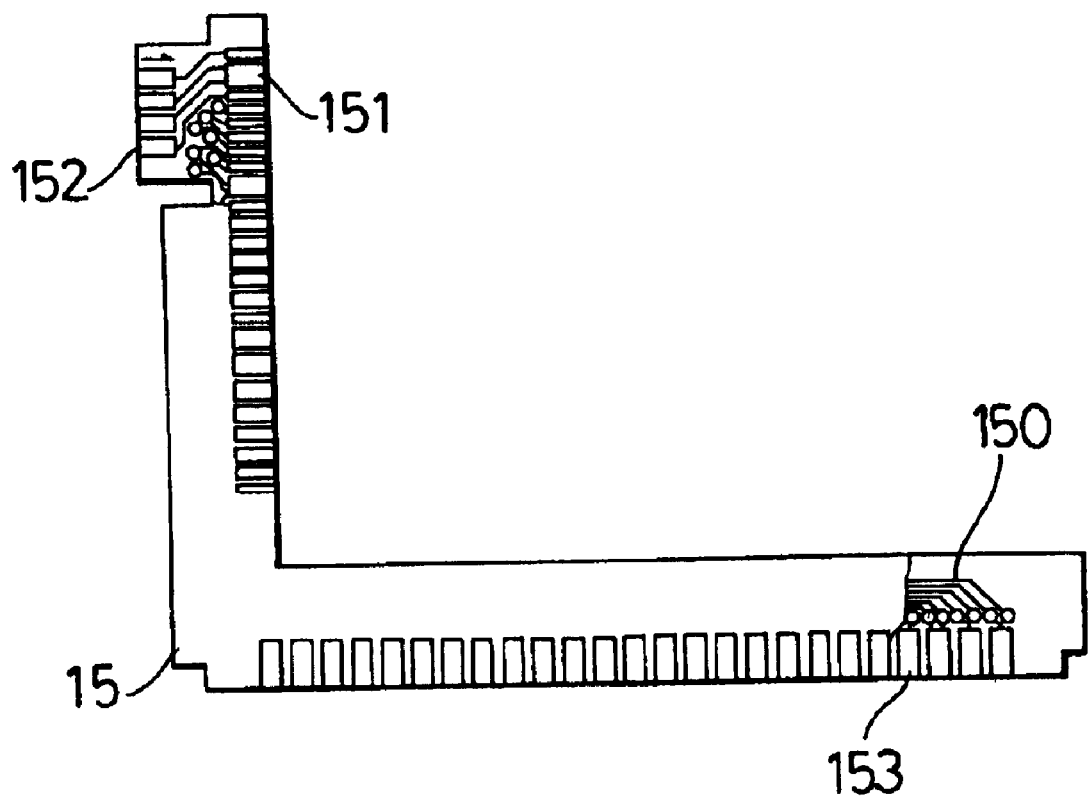
FIG. 3A is a plan view showing a circuit board of the memory card interface adapter of FIG. 1 in accordance with the present invention.
Figure 3B:
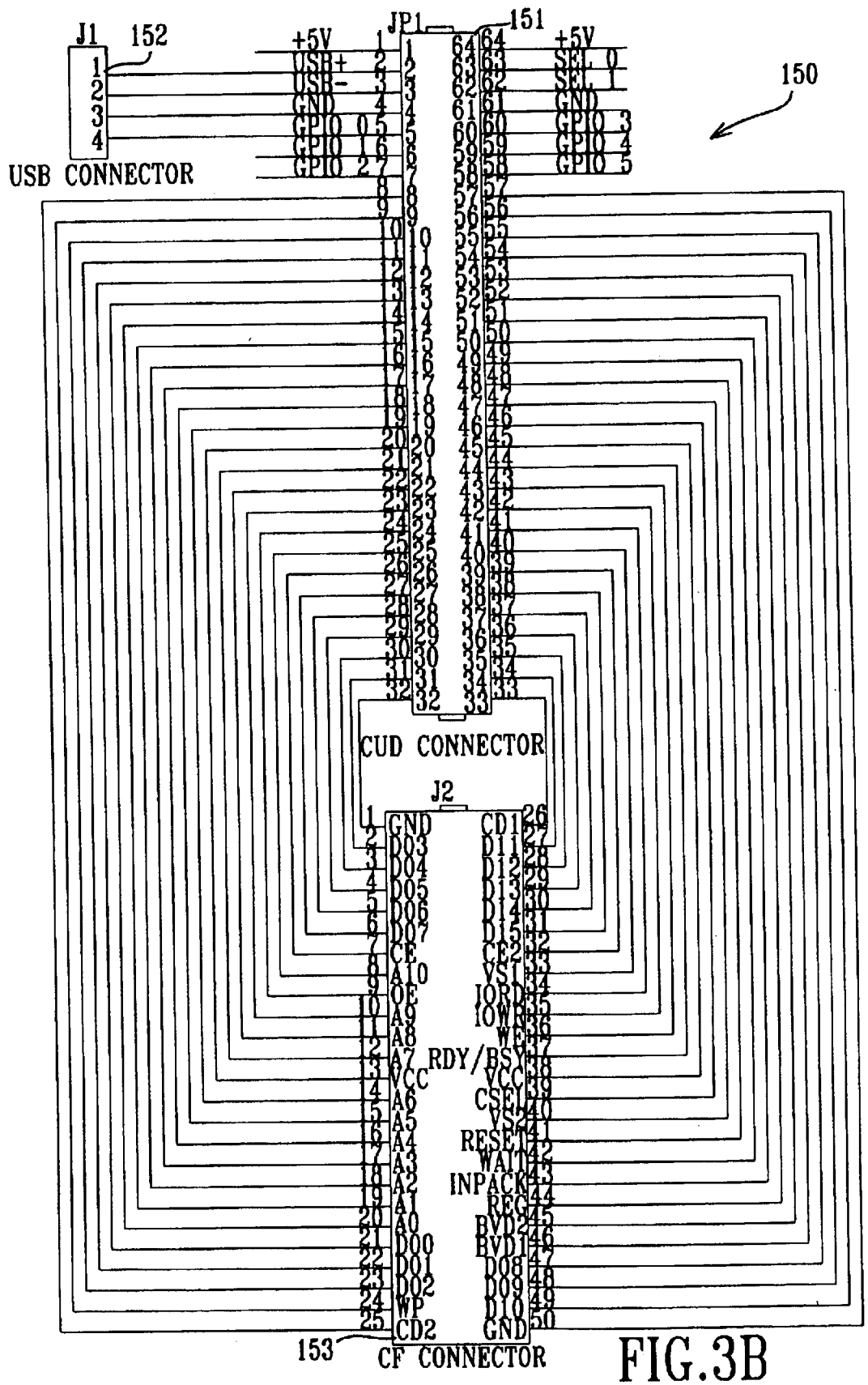
FIG. 3B is a detailed circuit diagram of the circuit board.

With reference to FIGS. 2 and 3A, the circuit board (15) is composed of a first plate and a second plate integrally extending from the first plate to form a substantially L-shaped appearance. The circuit board (15) has circuit layouts (150) (only a part of the circuit layouts is shown) disposed thereon. A first plurality of contacts (151), gold fingers, are formed along an inner edge of the first plate of the circuit board (15) to electrically link with a first connector (11). In this embodiment, the first connector (11) is designed to correspond to a STONE memory card. A second plurality of contacts (152) is disposed at an outer edge of the first plate and opposite to the first plurality of contacts (151) to form the connecting port (13). A third plurality of contacts (153) is formed along an outer edge of the second plate of the circuit board (15) to electrically link with the second connector (12). Therefore, the first connector (11) is electrically linked with the second connector (12) and the connecting port (13) via the circuit layouts (150) on the circuit board (15). The detailed circuit layout of the circuit board (15) is shown in FIG. 3B to present the relationship among all the contacts (151, 152, 153).

Figure 4:
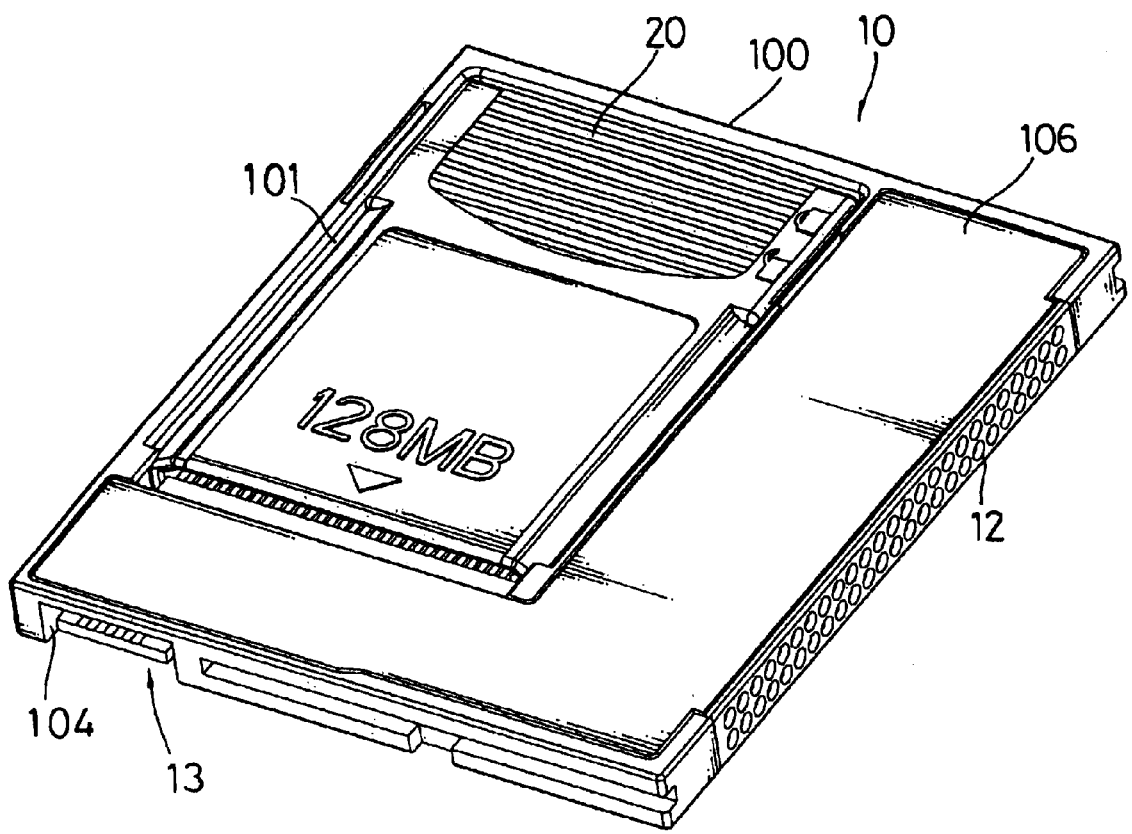
FIG. 4 is an operation view showing a memory card placed in the memory card interface adapter.
Figure 5:
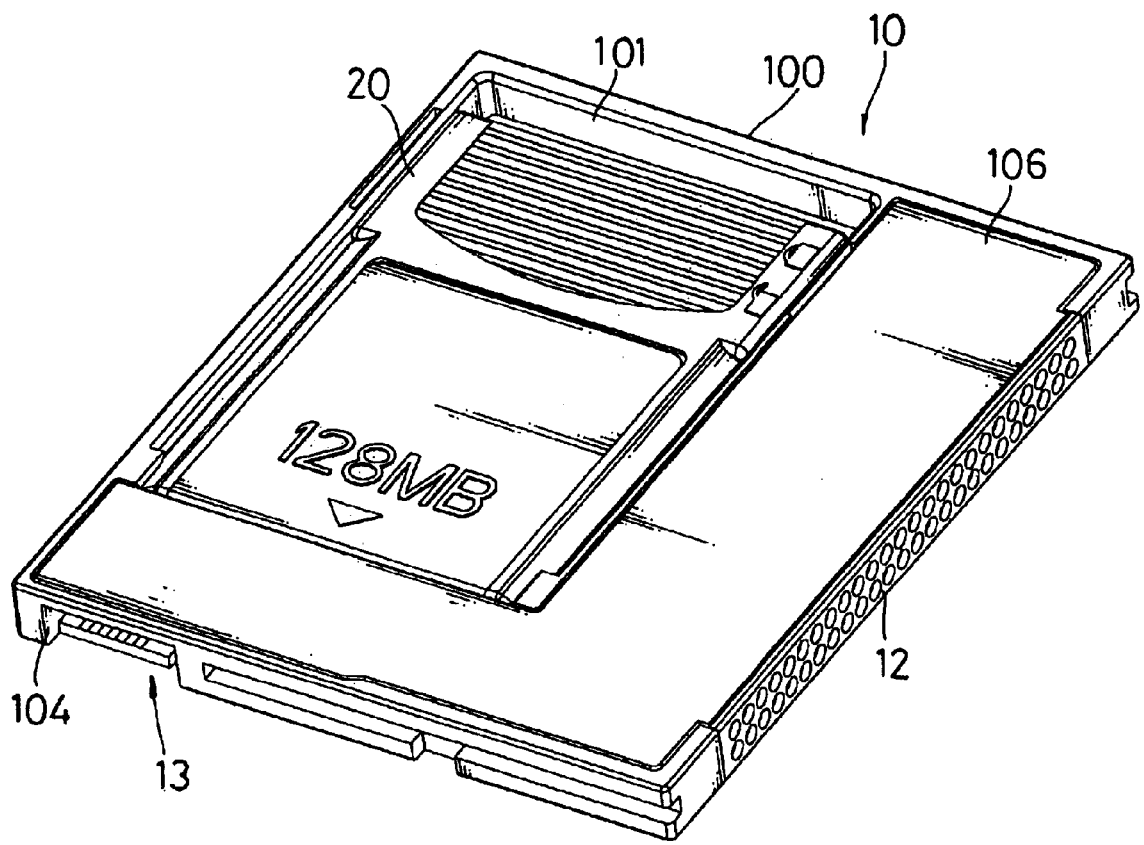
FIG. 5 is an operation view showing the memory card of FIG. 4 pushed forward to connect with a connector of the memory card interface adapter.

With reference to FIG. 4, when the memory card interface adapter of the present invention is applied to convert the interface of the memory card (20), the card (20) is firstly placed in the chamber (101) and the connecting interface of the card (20) is aligned with the first connector (11). Thereafter, the memory card (20) is horizontally pushed forward to securely link with the first connector (11) (as shown in FIG. 5).

When the memory card (20) is installed in the adapter body (10), the card (20) achieves an electrical connection to the second connector (12) and the connecting port (13). Therefore, the user is able to choose the CF card interface, i.e. the second connector (12) or the USB interface, i.e. the connecting port (13) to link with an external device to access the card (20).

Figure 6:
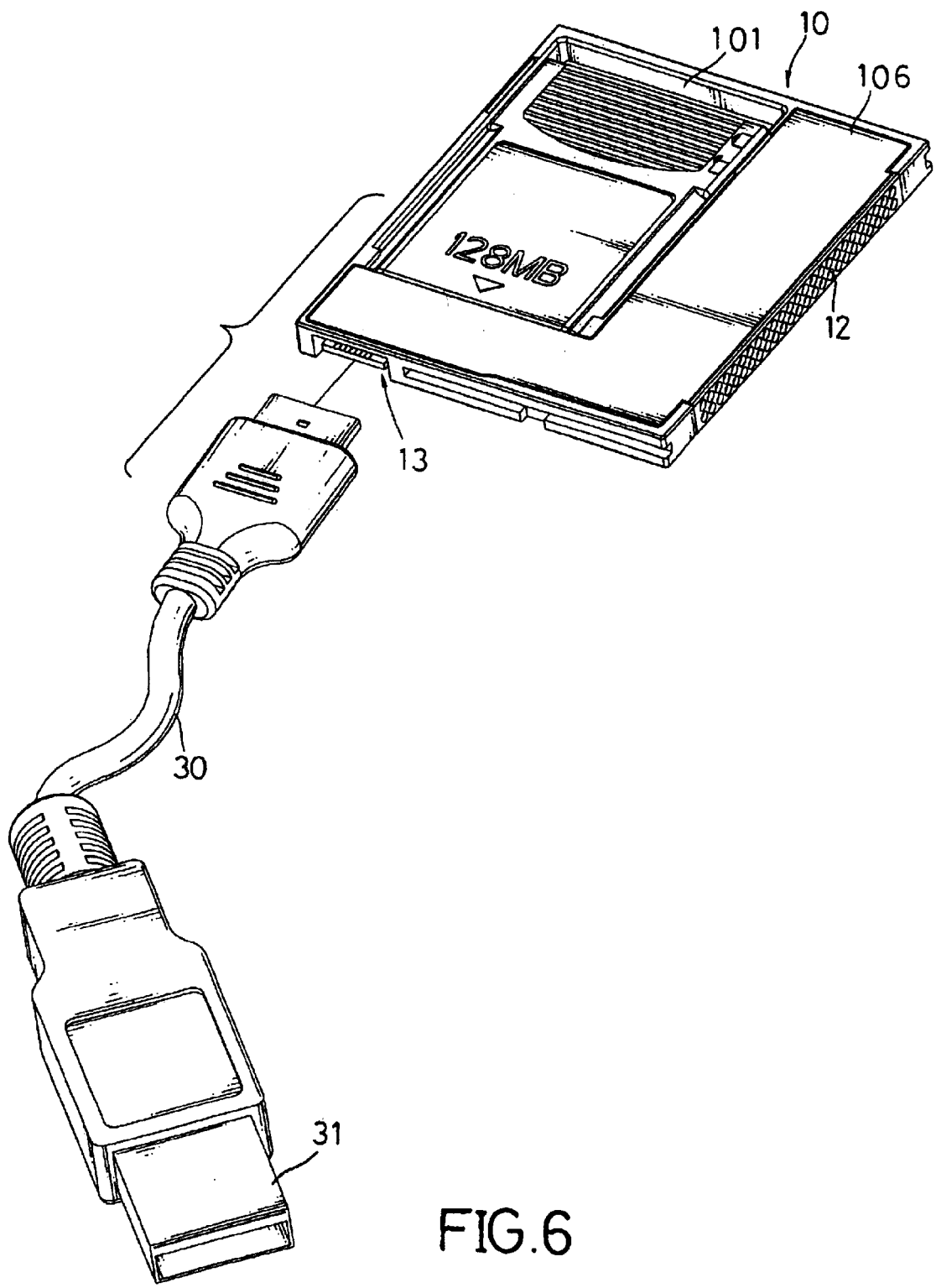
FIG. 6 is an operation view showing a USB connector of the memory card interface adapter being connected with a USB cable.

With reference to FIG. 6, when the memory card (20) is accessed through the USB interface, a USB cable (30) with a first end is connected to the connecting port (13) and a second end formed as a USB connector (31) is connected to a USB device (not shown).

Furthermore, since the appearance of the adapter body (10) is the same as a CF card, the adapter body (10) is able to be directly accessed by any device with a CF card interface.

The invention may be varied in many ways by a skilled person in the art. Such variations are not to be regarded as a departure from the spirit and scope of the invention, and all such modifications are intended to be included within the scope of the following claims.

What is claimed is:

1. A memory card interface adapter comprising:
   an adapter body defined with a first chamber to receive a memory card to be converted, wherein an appearance and a size of the adapter body are the same as the appearance and size of a CF card;
   a circuit board placed in the adapter body and formed with circuit layouts thereon;
   a first connector disposed in the adapter body and electrically connected to the circuit board, wherein the first connector is corresponded to the memory card received in the chamber;
   a second connector formed as a CF card interface and electrically connected to the circuit board, so that the second connector is electrically linked to the first connector;
   a USB connecting port electrically connected to the circuit board, so that the USB connecting port is electrically connected to the first connector and the second connector;
   said adapter body further having:
   a frame composed of a first side, a second side, and a third side that connecting between first ends of the first side and the second side, whereby a first breach to receive the second connector is defined by second ends of the first side and the second side:
   a substantially T-shaped partition with three ends respectively connected to the first, second and third sides of the frame, whereby the frame together with the T-shaped partition define said first chamber, a second chamber and a third chamber, wherein the second chamber communicates with the third chamber to form a substantially L-shaped space; and
   a second breach defined at the first side of the frame to receive the USB connecting port;
   wherein said frame is further sandwiched by a bottom plate and an L-shaped to plate that covers the second chamber and the third chamber.

2. The memory card interface adapter as claimed in claim 1, wherein the circuit board is formed by a first plate and a second plate integrally extending from the first plate thereby forming a substantially L-shaped appearance to be correspondingly received in said L-shaped space;
   the first plate having two opposite edges along which a first plurality and a second plurality of contacts are respectively formed, where the first plurality are for connecting to the first connector, and the second plurality of contacts is the USB connecting port; and
   the second plate having an outer edge along which a third plurality of contacts are formed to electrically connect to the second connector.

3. The memory card interface adapter as claimed in claim 1, wherein the first connector is corresponded to a memory card.

4. The memory card interface adapter as claimed in claim 1, wherein two gaps are respectively defined at the first side and the second side of the frame near the first breach to correspondingly wedge two protrusions extending from two opposite ends of the second connector.

5. The memory card interface adapter as claimed in claim 4, wherein the circuit board is formed by a first plate and a second plate integrally extending from the first plate thereby forming a substantially L-shaped appearance to be correspondingly received in said L-shaped space;
   the first plate having two opposite edges along which a first plurality of contacts for connecting to the first connector, and a second plurality of contacts as the USB connecting port are respectively formed; and
   the second plate having an outer edge along which a third plurality of contacts are formed to electrically connect to the second connector.

* * * * *